(12) United States Patent
Toda et al.

(10) Patent No.: US 10,825,771 B2
(45) Date of Patent: Nov. 3, 2020

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Nobuyuki Toda, Kawasaki Kanagawa (JP); Takeshi Yamamoto, Kawasaki Kanagawa (JP); Shinji Kawahara, Yokohama Kanagawa (JP); Kazuaki Yamaura, Yokohama Kanagawa (JP); Takashi Ishikawa, Tama Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 81 days.

(21) Appl. No.: 16/124,548

(22) Filed: Sep. 7, 2018

(65) Prior Publication Data
US 2019/0287917 A1    Sep. 19, 2019

(30) Foreign Application Priority Data
Mar. 16, 2018   (JP) .................................. 2018-050137

(51) Int. Cl.
*H01L 23/532* (2006.01)
*H01L 21/768* (2006.01)
*H01L 21/30* (2006.01)

(52) U.S. Cl.
CPC .... *H01L 23/53295* (2013.01); *H01L 21/3003* (2013.01); *H01L 21/76801* (2013.01); *H01L 21/76802* (2013.01)

(58) Field of Classification Search
CPC ............... H01L 21/3003; H01L 21/768; H01L 21/823821; H01L 23/532
See application file for complete search history.

(56) References Cited

U.S. PATENT DOCUMENTS

2015/0155173 A1* 6/2015 Hirota ............... H01L 21/02164
438/682
2016/0343750 A1  11/2016 Ishino et al.

FOREIGN PATENT DOCUMENTS

JP   H9-293869 A   11/1997
JP   2016-219550 A  12/2016

* cited by examiner

*Primary Examiner* — Dale E Page
*Assistant Examiner* — Wilner Jean Baptiste
(74) *Attorney, Agent, or Firm* — White & Case LLP

(57) ABSTRACT

A semiconductor device includes a semiconductor substrate, an insulating film provided on the semiconductor substrate, a first element disposed at least in a lower layer portion of the insulating film, a second element disposed at least in the lower layer portion of the insulating film, and a hydrogen barrier member provided on the semiconductor substrate. The hydrogen barrier member is made from a material transmitting hydrogen less easily than does a material of the insulating film. The hydrogen barrier member and the semiconductor substrate surround the second element. The hydrogen barrier member does not surround the first element.

7 Claims, 6 Drawing Sheets

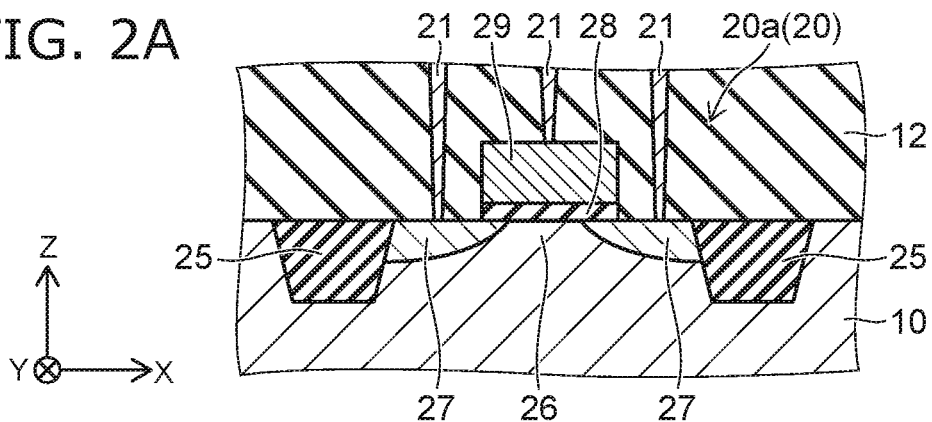
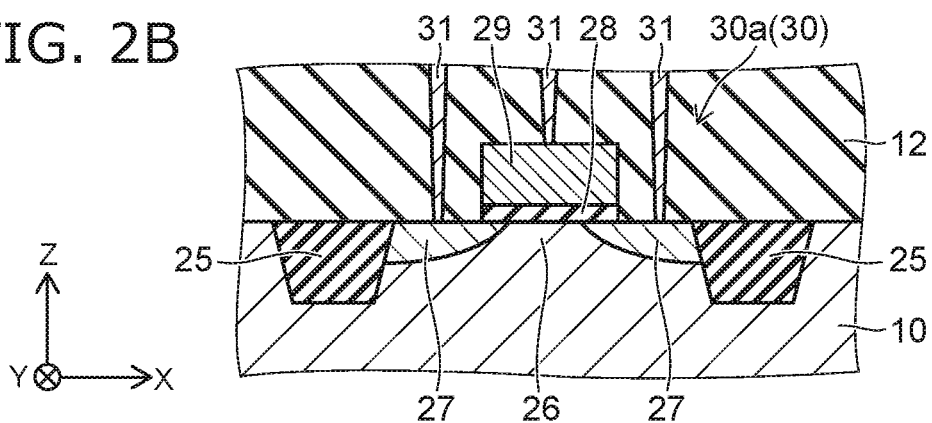
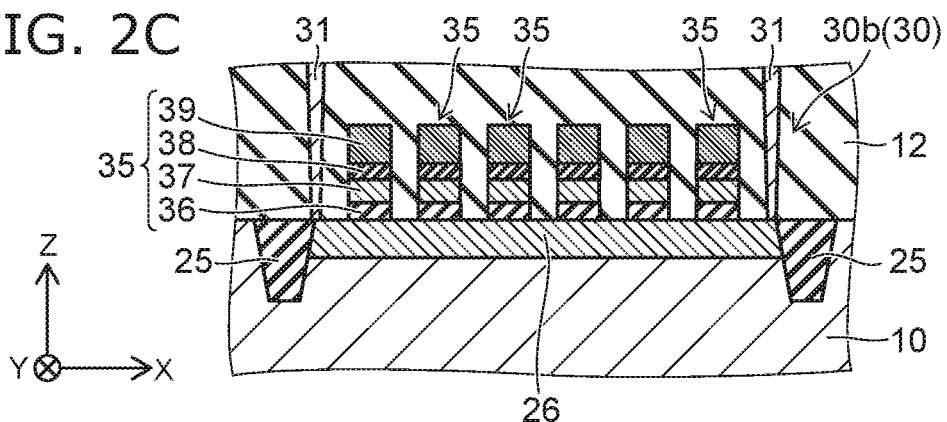
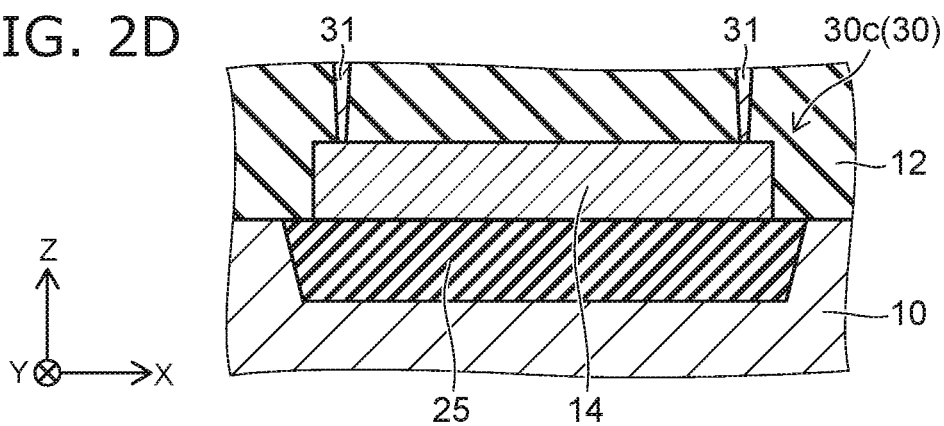

SEMICONDUCTOR DEVICE

CROSS-REFERENCE TO RELATED APPLICATIONS

This application is based upon and claims the benefit of priority from Japanese Patent Application No. 2018-050137, filed on Mar. 16, 2018; the entire contents of which are incorporated herein by reference.

FIELD

Embodiments relate to a semiconductor device.

BACKGROUND

Hydrogen sintering may be performed when manufacturing a semiconductor device. It is known that the reliability of a MOSFET (Metal-Oxide-Semiconductor Field-Effect Transistor) or the like is increased by performing hydrogen sintering in which dangling bonds existing at an interface between silicon and silicon oxide are terminated by hydrogen atoms. On the other hand, hydrogen sintering may change the characteristics of the element.

BRIEF DESCRIPTION OF THE DRAWINGS

FIGS. 2A to 2D are cross-sectional views showing a specific example of elements of the first embodiment;

DETAILED DESCRIPTION

A semiconductor device according to one embodiment, includes a semiconductor substrate, an insulating film provided on the semiconductor substrate, a first element disposed at least in a lower layer portion of the insulating film, a second element disposed at least in the lower layer portion of the insulating film, and a hydrogen barrier member provided on the semiconductor substrate. The hydrogen barrier member is made from a material transmitting hydrogen less easily than does a material of the insulating film. The hydrogen barrier member and the semiconductor substrate surround the second element. The hydrogen barrier member does not surround the first element.

First Embodiment

A first embodiment will now be described.

Figure 1A:
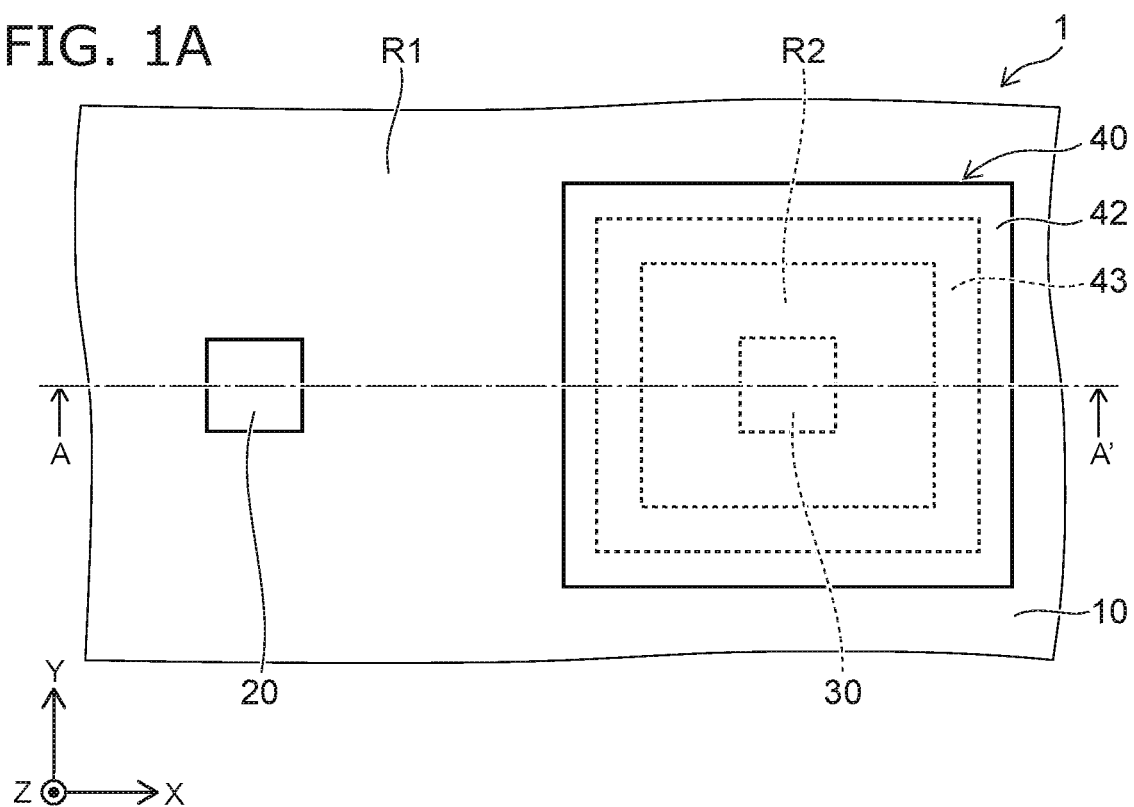
FIG. 1A is a plan view showing a semiconductor device according to a first embodiment.
Figure 1B:
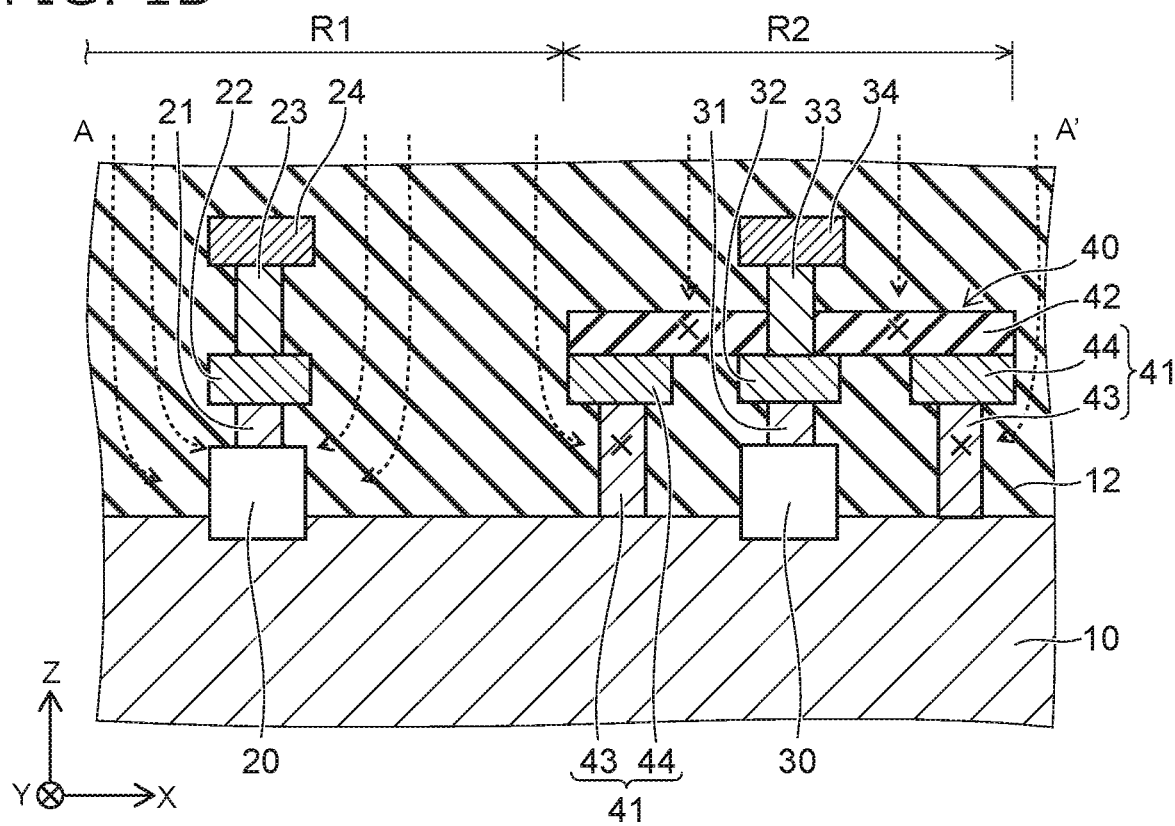
FIG. 1B is a cross-sectional view along line A-A' shown in FIG. 1A.

FIG. 1A is a plan view showing a semiconductor device according to the embodiment; and FIG. 1B is a cross-sectional view along line A-k shown in FIG. 1A.

The drawings are schematic and are drawn with appropriate exaggerations or omissions. For example, the components are drawn to be larger and fewer than the actual components. The numbers, dimensional ratios, etc., of the components do not always match between the drawings.

In the semiconductor device 1 according to the embodiment as shown in FIGS. 1A and 1B, a semiconductor substrate 10 that is made of, for example, silicon (Si) is provided; and an inter-layer insulating film 12 that is made of, for example, silicon oxide (SiO) is provided on the semiconductor substrate 10. A region R1 where hydrogen sintering is performed and a region R2 where hydrogen sintering is substantially not performed exist in the semiconductor device 1. The inter-layer insulating film 12 is not illustrated in FIG. 1A.

XYZ orthogonal coordinates are displayed in FIGS. 1A and 1B to clarify the drawings. The arrangement direction of the semiconductor substrate 10 and the inter-layer insulating film 12 is taken as a "Z-direction;" and two mutually-orthogonal directions parallel to the interface between the semiconductor substrate 10 and the inter-layer insulating film 12 are taken as an "X-direction" and a "Y-direction." This is similar for the other drawings described below as well. For convenience of description, a direction that is in the Z-direction from the semiconductor substrate 10 toward the inter-layer insulating film 12 is called "up;" and the reverse direction is called "down."

An element 20 is provided in the region R1. The element 20 is formed through the upper layer portion of the semiconductor substrate 10 and the lower layer portion of the inter-layer insulating film 12 or is formed in the lower layer portion of the inter-layer insulating film 12. The element 20 is, for example, a transistor, e.g., a MOSFET. Because the element 20 undergoes hydrogen sintering, for example, many dangling bonds at the interface between the silicon and the silicon oxide are terminated by the hydrogen atoms.

In the region R1, a contact 21, an interconnect 22, a via 23, and an interconnect 24 are provided inside the inter-layer insulating film 12. For example, the element 20 is connected to the contact 21; the contact 21 is connected to the interconnect 22; the interconnect 22 is connected to the via 23; and the via 23 is connected to the interconnect 24. The contact 21, the interconnect 22, the via 23, and the interconnect 24 are not illustrated in FIG. 1A.

An element 30 is provided in the region R2. The element 30 also is disposed through the upper layer portion of the semiconductor substrate 10 and the lower layer portion of the inter-layer insulating film 12 or is disposed in the lower layer portion of the inter-layer insulating film 12. The element 30 is, for example, a transistor, a resistance element, or a memory element. Because the element 30 substantially does not undergo hydrogen sintering, compared to the element 20, the proportion of dangling bonds at the interface between the silicon and the silicon oxide that are not terminated by hydrogen atoms is high.

In the region R2, a contact 31, an interconnect 32, a via 33, and an interconnect 34 are provided inside the inter-layer insulating film 12. For example, the element 30 is connected to the contact 31; the contact 31 is connected to the interconnect 32; the interconnect 32 is connected to the via 33; and the via 33 is connected to the interconnect 34. The contact 31, the interconnect 32, the via 33, and the interconnect 34 are not illustrated in FIG. 1A.

In the region R2, a hydrogen barrier member 40 is provided on the semiconductor substrate 10. In the hydrogen barrier member 40, a sidewall 41 that has a frame-like configuration surrounding the element 30 when viewed from above is provided; and a top plate 42 that has a rectangular plate configuration is provided. The top plate 42 is disposed on the interconnect 32 and contacts the interconnect 32; and the via 33 pierces the top plate 42. The lower face of the top plate 42 contacts the upper end of the sidewall 41. Therefore, the configuration of the hydrogen barrier member 40 made of the sidewall 41 and the top plate 42 is a rectangular parallelepiped box shape having an open lower face. The lower face of the hydrogen barrier member 40 is covered with the semiconductor substrate 10.

As a result, the hydrogen barrier member 40 and the semiconductor substrate 10 surround the element 30. On the other hand, because the element 20 is disposed outside the hydrogen barrier member 40, the hydrogen barrier member 40 does not surround the element 20. To "surround" may mean to substantially surround, to seal without a gap, or to surround with a slight gap. For example, a thin gate insulating film may be interposed between the semiconductor substrate 10 and the hydrogen barrier member 40; and a portion of the hydrogen barrier member 40 may extend onto STI (Shallow Trench Isolation (an element-separating insulating film)) formed in the upper layer portion of the semiconductor substrate 10. Also, metal members such as interconnects, vias, etc., may pierce the hydrogen barrier member 40. In an example, the width of the hydrogen barrier member 40, i.e., the lengths in the X-direction and the Y-direction, is several μm to several hundred μm; and the height, i.e., the length in the Z-direction, is several hundred nm to several μm.

The sidewall 41 is made of a metal. The sidewall 41 includes a lower portion 43 and an upper portion 44; and the width of the upper portion 44 is wider than the width of the lower portion 43. The upper portion 44 is not illustrated in FIG. 1A. The lower portion 43 is formed simultaneously with the contacts 21 and 31; and the composition of the lower portion 43 is substantially the same as the compositions of the contacts 21 and 31, The upper portion 44 is formed simultaneously with the interconnects 22 and 32; and the composition of the upper portion 44 is substantially the same as the compositions of the interconnects 22 and 32. The top plate 42 is made of silicon nitride (SiN). Metals and silicon nitride transmit hydrogen less easily than does silicon oxide. Therefore, the transmittance of hydrogen per unit thickness is lower for the hydrogen barrier member 40 than for the inter-layer insulating film 12. Although the via 33 pierces the top plate 42, the via 33 does not transmit hydrogen easily because the via 33 is made of a metal.

Effects of the embodiment will now be described.

The broken line arrows shown in FIG. 1B schematically illustrate the movement of hydrogen.

When manufacturing the semiconductor device 1 according to the embodiment, the element 20, the element 30, the hydrogen barrier member 40, the inter-layer insulating film 12, etc., are formed; subsequently, hydrogen sintering is performed by exposing to a hydrogen atmosphere at a high temperature. At this time, hydrogen ions ($H^+$) pass through the inter-layer insulating film 12 and reach the element 20. Thereby, at the element 20, the dangling bonds that exist at the interface between the silicon and the silicon oxide are terminated by the hydrogen. As a result, the reliability of the element 20 increases.

On the other hand, the movement of the hydrogen that penetrates the interior of the inter-layer insulating film 12 is blocked by the hydrogen barrier member 40 and the semiconductor substrate 10; therefore, the hydrogen substantially does not reach the element 30. Therefore, the change of the characteristics of the element 30 caused by bonding with hydrogen can be suppressed. As a result, the designed characteristics of the element 30 can be obtained. Thus, according to the embodiment, the characteristics of the element 20 and the element 30 can be corrected individually as necessary.

Also, according to the embodiment, the lower portion 43 of the sidewall 41 of the hydrogen barrier member 40 can be formed simultaneously with the contacts 21 and 31; and the upper portion 44 can be formed simultaneously with the interconnects 22 and 32. Therefore, an increase of the manufacturing cost due to the formation of the hydrogen barrier member 40 can be suppressed.

Specific examples of elements of the embodiment will now be described.

FIG. 2A is a cross-sectional view showing a specific example of the element 20; and FIGS. 2B to 2D are cross-sectional views showing specific examples of the element 30.

The types of the element 20 and the element 30 are not limited to the following specific examples.

As shown in FIG. 2A, the element 20 on which the hydrogen sintering is performed may be, for example, a MOSFET 20a. The MOSFET 20a may be included in, for example, a logic circuit. In the MOSFET 20a, a STI 25 is formed in the upper layer portion of the semiconductor substrate 10; and a pair of source/drain regions 27 is formed to be separated from each other inside an active area 26 surrounded with the STI 25.

A gate insulating film 28 that is made of silicon oxide is provided in the lower layer portion of the inter-layer insulating film 12 on the active area 26; and a gate electrode 29 is provided on the gate insulating film 28. The source/drain regions 27 and the gate electrode 29 are connected respectively to the contacts 21. In the MOSFET 20a, the dangling bonds that are at the interface between the active area 26 and the gate insulating film 28 are terminated by the hydrogen sintering. Therefore, in the MOSFET 20a, the change over time of the characteristics is low; and the reliability is high.

As shown in FIG. 2B, the element 30 on which hydrogen sintering is not performed may be, for example, a MOSFET 30a. For example, the MOSFET 30a may be included in a circuit other than a logic circuit. The configuration of the MOSFET 30a is similar to that of the MOSFET 20a. Because the MOSFET 30a substantially does not undergo hydrogen sintering, the fluctuation of the threshold caused by the hydrogen sintering is suppressed. Therefore, the MOSFET 30a has the designed threshold.

As shown in FIG. 2C, the element 30 may be, for example, a memory element 30b. In the memory element 30b, multiple stacked bodies 35 are provided on the active area 26. In each of the stacked bodies 35, a tunneling insulating film 36, a floating gate electrode 37, a blocking insulating film 38, and a control gate electrode 39 are stacked in this order. The two end portions of the active area 26 are connected respectively to the contacts 31. Because the memory element 30b substantially does not undergo hydrogen sintering, the fluctuation of the threshold caused by the hydrogen sintering is suppressed. Therefore, the memory element 30b operates as designed.

As shown in FIG. 2D, the element 30 may be, for example, a resistance element 30c. In the resistance element 30c, the STI 25 is provided in the upper layer portion of the semiconductor substrate 10; and a resistance member 14 that is made of, for example, polysilicon is provided on the STI 25. The two end portions of the resistance member 14 are connected respectively to the contacts 31. Because the resistance element 30c substantially does not undergo hydrogen sintering, the fluctuation of the resistivity of the polysilicon caused by the hydrogen sintering is suppressed. Therefore, the resistance element 30c has the designed resistance value.

Second Embodiment

A second embodiment will now be described.

Figure 3A:
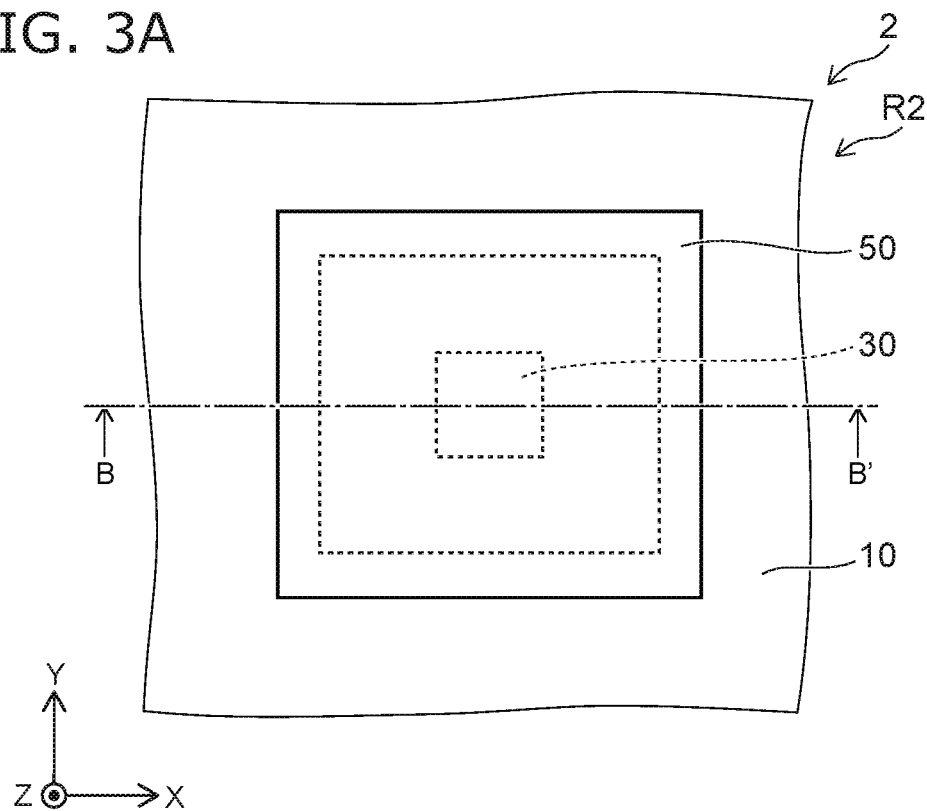
FIG. 3A is a plan view showing a semiconductor device according to a second embodiment.
Figure 3B:
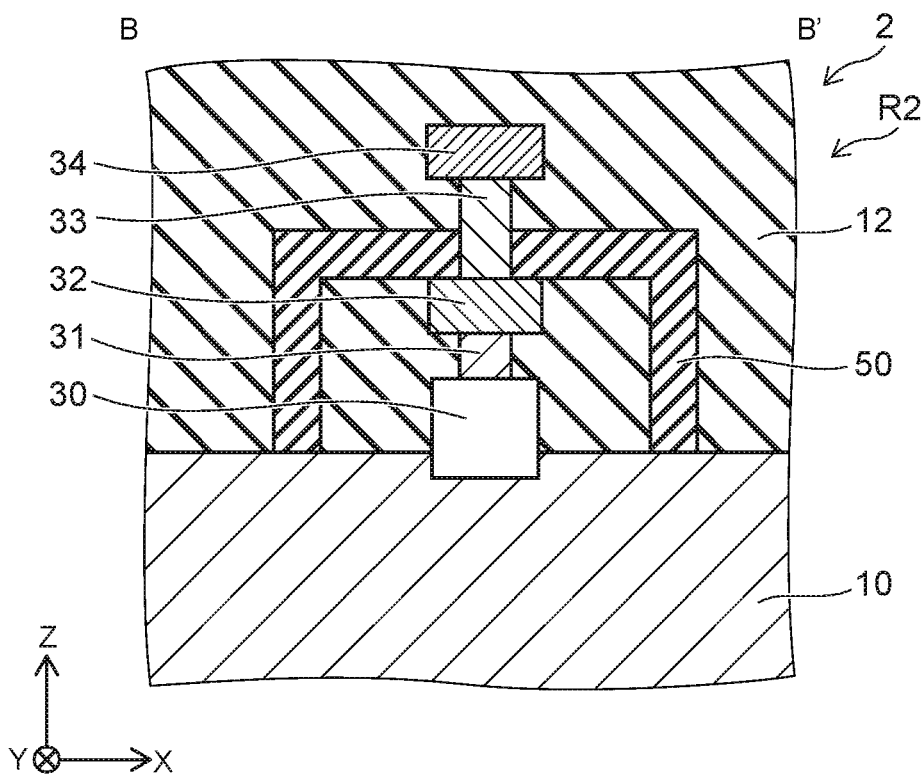
FIG. 3B is a cross-sectional view along line B-B' shown in FIG. 3A.

FIG. 3A is a plan view showing a semiconductor device according to the embodiment; and FIG. 3B is a cross-sectional view along line B-B' shown in FIG. 3A.

As shown in FIGS. 3A and 3B, the configuration of a hydrogen barrier member 50 of the semiconductor device 2 according to the embodiment is different from that of the semiconductor device 1 according to the first embodiment described above (referring to FIGS. 1A and 1B). Other than the hydrogen barrier member, the configuration of the semiconductor device 2 is similar to that of the semiconductor device 1 according to the first embodiment. In other words, the element 20, etc., are provided in the region R1; and the element 30, etc., are provided in the region R2.

The hydrogen barrier member 50 is provided on the semiconductor substrate 10; and the configuration of the hydrogen barrier member 50 is a substantially rectangular parallelepiped box shape having an open lower face. The lower face of the hydrogen barrier member 50 is covered with the semiconductor substrate 10. The hydrogen barrier member 50 is formed as one body of silicon nitride. Accordingly, the hydrogen barrier member 50 is formed of a material that transmits hydrogen less easily than does silicon oxide which is the material of the inter-layer insulating film 12. The hydrogen barrier member 50 and the semiconductor substrate 10 surround the element 30. On the other hand, the hydrogen barrier member 50 does not surround the element 20 (referring to FIGS. 1A and 1B).

According to the embodiment as well, similarly to the first embodiment described above, the hydrogen barrier member 50 blocks the hydrogen; thereby, the hydrogen sintering can be performed on the element 20 disposed in the region R1; and the hydrogen sintering substantially is not performed on the element 30 disposed in the region R2. As a result, the characteristics of the element 20 and the element 30 can be corrected individually.

Otherwise, the configuration, the operations, and the effects of the embodiment are similar to those of the first embodiment described above.

Third Embodiment

A third embodiment will now be described.

Figure 4A:
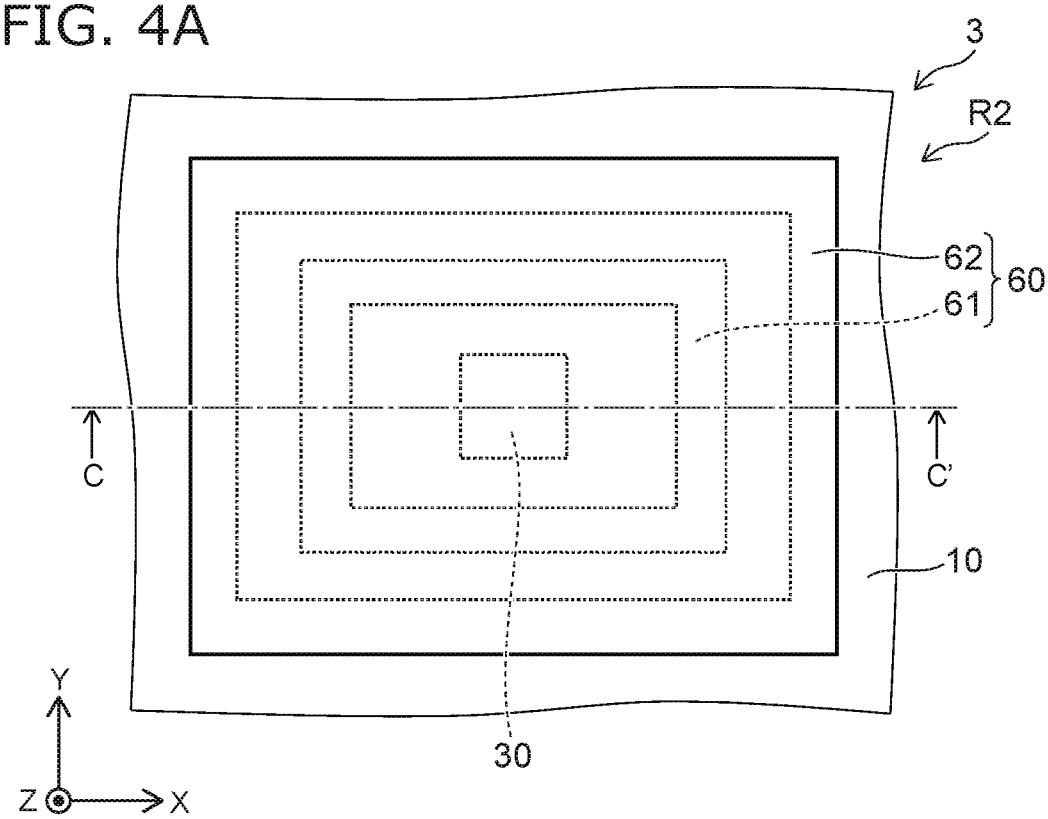
FIG. 4A is a plan view showing a semiconductor device according to a third embodiment.
Figure 4B:
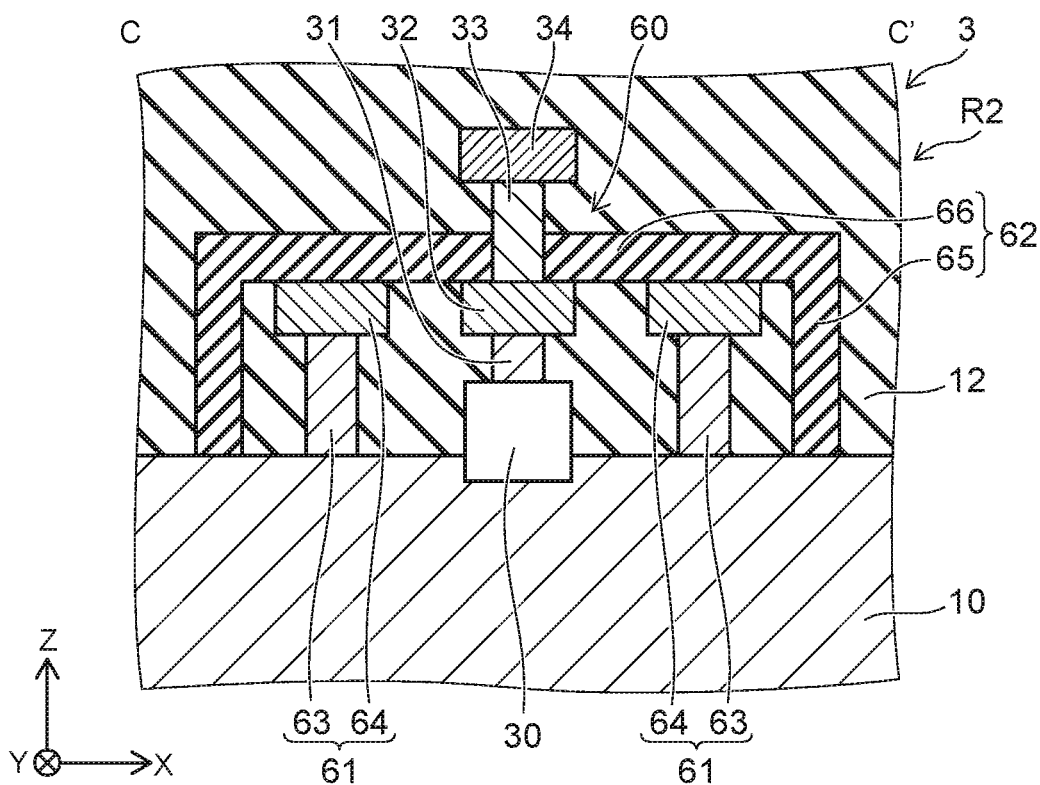
FIG. 4B is a cross-sectional view along line C-C' shown in FIG. 4A.

FIG. 4A is a plan view showing a semiconductor device according to the embodiment; and FIG. 4B is a cross-sectional view along line C-C' shown in FIG. 4A.

The embodiment is an example in which the first embodiment and the second embodiment described above are combined.

In the semiconductor device 3 according to the embodiment as shown in FIGS. 4A and 4B, a hydrogen barrier member 60 is provided in the region R2. Other than the hydrogen barrier member, the configuration of the semiconductor device 3 is similar to that of the first embodiment. In other words, the element 20 (referring to FIGS. 1A and 1B), etc., are provided in the region R1; and the element 30, etc., are provided in the region R2.

The hydrogen barrier member 60 is provided on the semiconductor substrate 10. In the hydrogen barrier member 60, a sidewall 61 that is made from a metal and has a frame-like configuration surrounding the element 30 when viewed from above is provided; and a box-shaped member 62 that is formed as one body of silicon nitride and surrounds the element 30 and the sidewall 61 is provided.

The configuration of the sidewall 61 is similar to the configuration of the sidewall 41 (referring to FIGS. 1A and 1B) of the first embodiment. In other words, the sidewall 61 includes a lower portion 63 and an upper portion 64; and the width of the upper portion 64 is wider than the width of the lower portion 63. The lower portion 63 is formed simultaneously with the contacts 21 and 31; and the composition of the lower portion 63 is substantially the same as the compositions of the contacts 21 and 31. The upper portion 64 is formed simultaneously with the interconnects 22 and 32; and the composition of the upper portion 64 is substantially the same as the compositions of the interconnects 22 and 32.

The configuration of the box-shaped member 62 is similar to the configuration of the hydrogen barrier member 50 (referring to FIGS. 3A and 3B) of the second embodiment. In other words, four side plates 65 and one top plate 66 are provided as one body in the box-shaped member 62; thereby, the configuration of the box-shaped member 62 is a rectangular parallelepiped box shape having an open lower face. The open lower face of the box-shaped member 62 is covered with the semiconductor substrate 10. When viewed from above, the side plate 65 is disposed at a position surrounding the sidewall 61. The top plate 66 is disposed on the interconnect 32 and on the sidewall 61 and contacts the upper face of the interconnect 32 and the upper face of the sidewall 61. The via 33 pierces the top plate 66. Thus, the hydrogen barrier member 60 is made from a material transmitting hydrogen less easily than does silicon oxide which is the material of the inter-layer insulating film 12; the hydrogen barrier member 60 and the semiconductor substrate 10 surround the element 30; and the hydrogen barrier member 60 does not surround the element 20.

According to the embodiment, the element 30 is doubly surrounded with the sidewall 61 and the box-shaped member 62; therefore, the hydrogen that reaches the element 30 can be suppressed more effectively.

Otherwise, the configuration, the operations, and the effects of the embodiment are similar to those of the first embodiment described above.

Fourth Embodiment

A fourth embodiment will now be described.

The embodiment is a method for manufacturing the semiconductor device according to the third embodiment described above.

FIGS. 5A to 5C and FIGS. 6A to 6C are cross-sectional views showing the method for manufacturing the semiconductor device according to the embodiment.

Figure 5A:
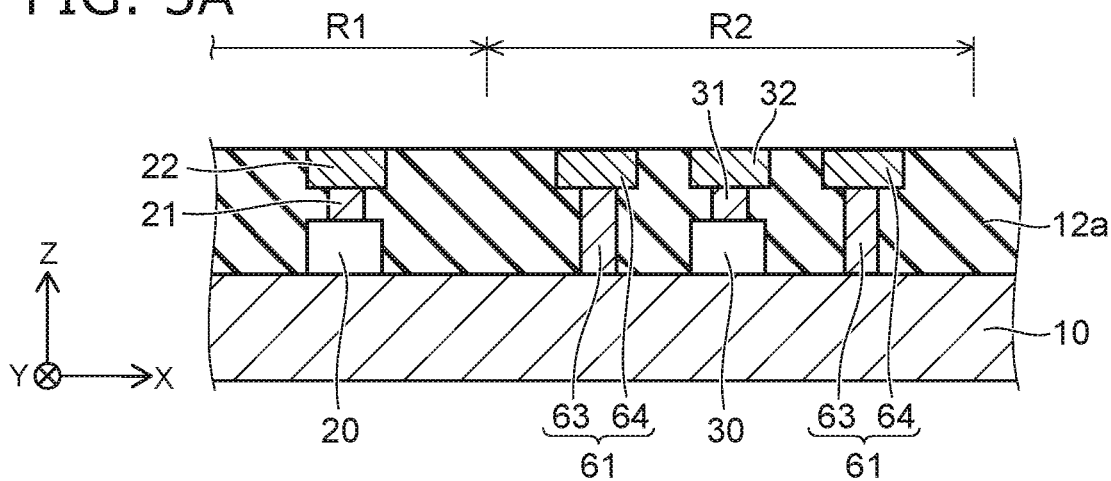
FIGS. 5A to 5C and FIGS. 6A to 6C are cross-sectional views showing a method for manufacturing a semiconductor device according to a fourth embodiment.

First, as shown in FIG. 5A, an inter-layer insulating film 12a that is made of silicon oxide (SiO) is formed on the semiconductor substrate 10; the element 20 is formed in the region R1; and the element 30 is formed in the region R2. Also, the contact 21 and the interconnect 22 are formed in the region R1; and the contact 31, the interconnect 32, and the sidewall 61 are formed in the region R2. The sidewall 61 is disposed to surround the element 30. The contact 21, the contact 31, and the lower portion 63 of the sidewall 61 are formed simultaneously. Also, the interconnect 22, the interconnect 32, and the upper portion 64 of the sidewall 61 are formed simultaneously. The interconnect 22, the interconnect 32, and the upper portion 64 are exposed at the upper face of the inter-layer insulating film 12a.

Figure 5B:
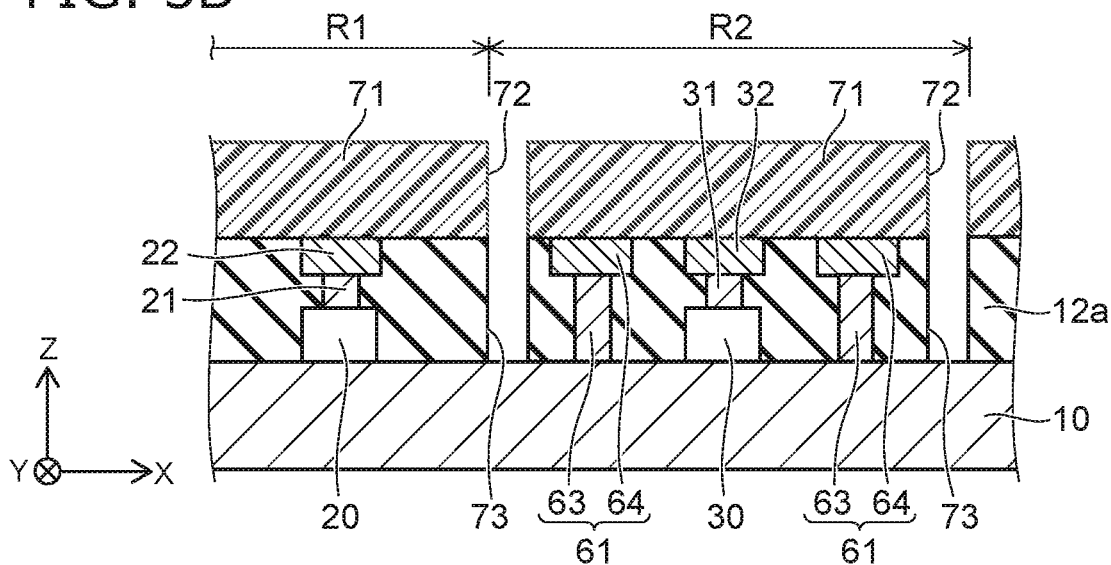

Then, as shown in FIG. 5B, a resist film 71 is formed on the inter-layer insulating film 12a. An opening 72 is formed in the resist film 71. The configuration of the opening 72 when viewed from above is a frame-like configuration along the outer edge of the region R2 and surrounds the element 30 and the sidewall 61. Then, the inter-layer insulating film 12a is etched using the resist film 71 as a mask. Thereby, a trench 73 is formed in the inter-layer insulating film 12a. The trench 73 reaches the semiconductor substrate 10. Then, the resist film 71 is removed.

Figure 5C:
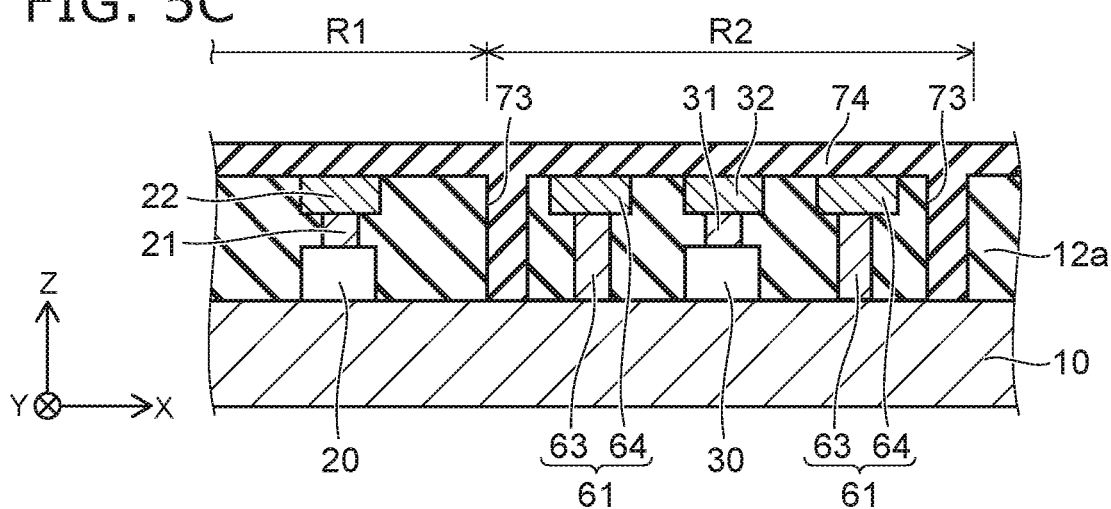

Continuing as shown in FIG. 5C, silicon nitride (SiN) is deposited on the entire surface; and the upper face is planarized by CMP (Chemical Mechanical Polishing). Thereby, a silicon nitride member 74 is formed on the inter-layer insulating film 12a and inside the trench 73.

Figure 6A:
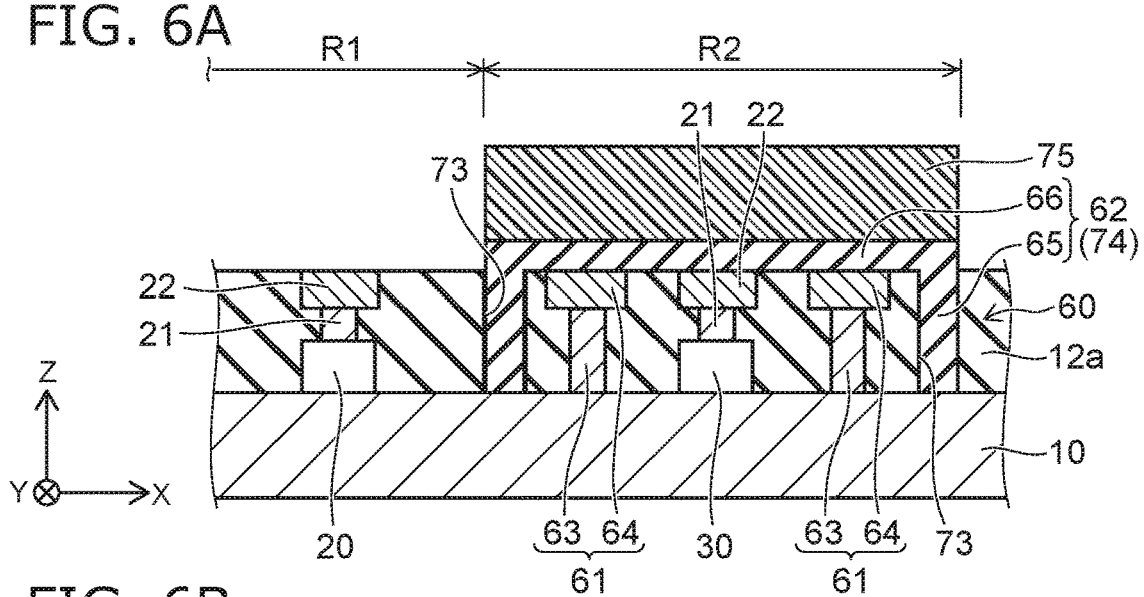

Continuing as shown in FIG. 6A, a resist film 75 is formed in the region R2. Then, the silicon nitride member 74 is etched using the resist film 75 as a mask. Thereby, the portion of the silicon nitride member 74 disposed in the region R1 is removed; and the portion of the silicon nitride member 74 disposed in the region R2 remains. The portion of the silicon nitride member 74 that remains in the region R2 is used to form the box-shaped member 62. More specifically, the portion of the silicon nitride member 74 remaining inside the trench 73 is used to form the side plate 65; and the portion of the silicon nitride member 74 remaining on the inter-layer insulating film 12a is used to form the top plate 66. The hydrogen barrier member 60 is formed of the sidewall 61 and the box-shaped member 62, Then, the resist film 75 is removed.

Figure 6B:
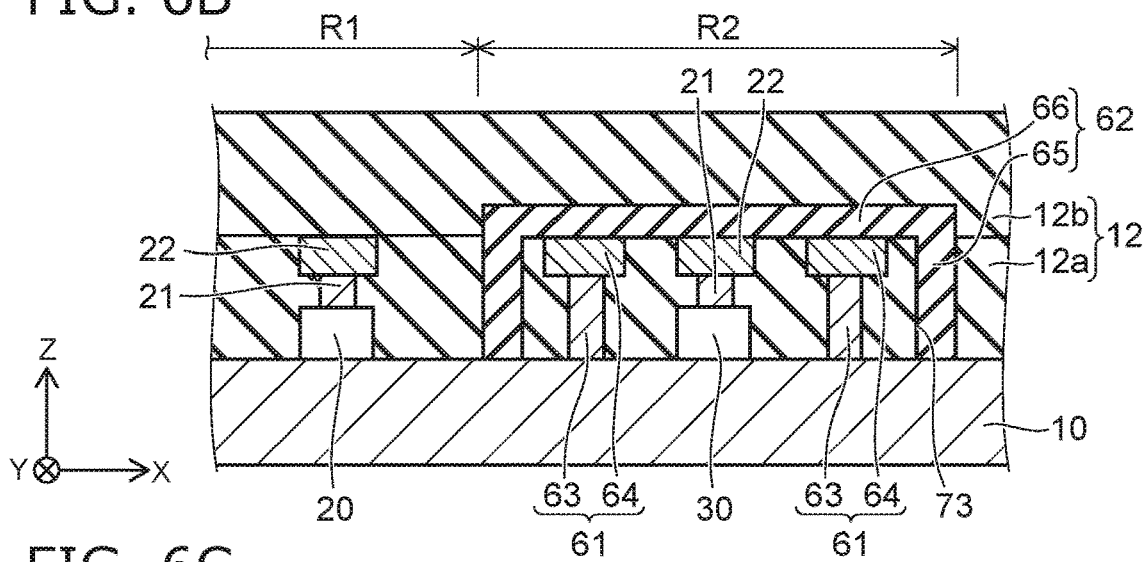

Continuing as shown in FIG. 6B, an inter-layer insulating film 12b is formed by depositing silicon oxide on the entire surface. The inter-layer insulating film 12 is formed of the inter-layer insulating films 12a and 12b.

Figure 6C:
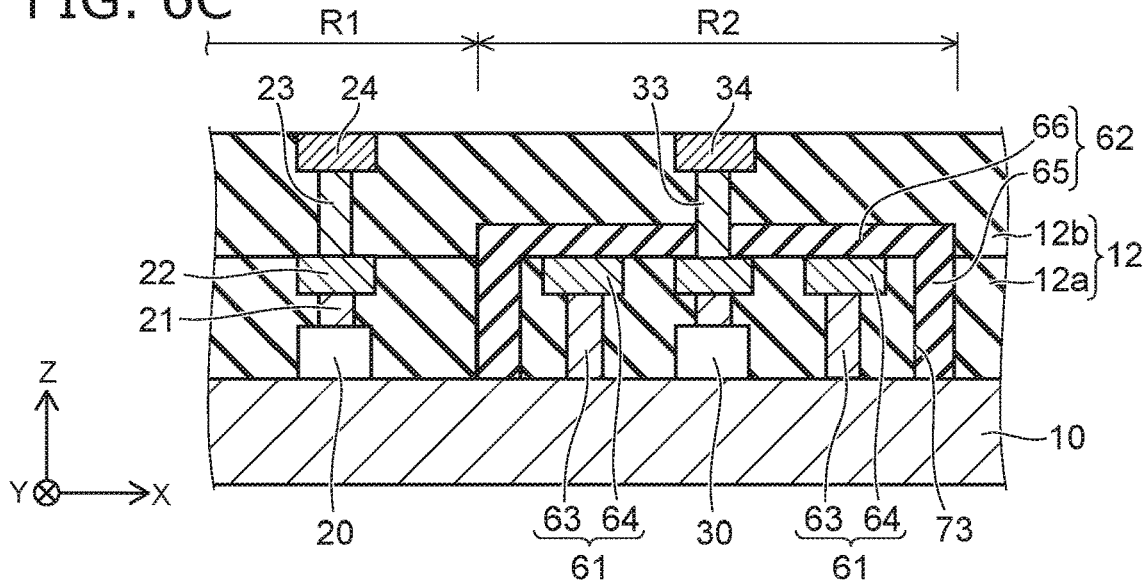

Then, as shown in FIG. 6C, the vias 23 and 33 and the interconnects 24 and 34 are formed inside the inter-layer insulating film 12b. Thus, the semiconductor device 3 is manufactured.

According to the embodiment, the lower portion 63 of the sidewall 61, the contact 21, and the contact 31 can be formed simultaneously; and the upper portion 64 of the sidewall 61, the interconnect 22, and the interconnect 32 can be formed simultaneously. Thereby, the increase of the manufacturing cost due to the formation of the hydrogen barrier member 60 can be suppressed.

Otherwise, the configuration, the operations, and the effects of the embodiment are similar to those of the third embodiment described above.

Although an example is shown in the embodiments described above in which the configuration of the hydrogen barrier member is a rectangular parallelepiped, this is not limited thereto; and the hydrogen barrier member may have any configuration. Also, although one element 20 and one element 30 are shown in the embodiments described above, many elements 20 may be provided in the region R1; and many elements 30 may be provided in the region R2. In such a case, one hydrogen barrier member may be provided in the region R2; and all of the elements 30 may be provided in the region R2 and surrounded with the one hydrogen barrier member. Or, the region R2 may be divided into multiple subregions; and the hydrogen barrier member may be provided in each of the subregions.

According to the embodiments described above, a semiconductor device can be realized in which characteristics of the elements are excellent.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device, comprising:
    a semiconductor substrate;
    an insulating film provided on the semiconductor substrate;
    a first element disposed at least in a lower layer portion of the insulating film;
    a second element disposed at least in the lower layer portion of the insulating film; and
    a hydrogen barrier member provided on the semiconductor substrate, the hydrogen barrier member being made from a material transmitting hydrogen less easily than does a material of the insulating film, the hydrogen barrier member and the semiconductor substrate surrounding the second element, the hydrogen barrier member not surrounding the first element, and the insulating film being disposed between the hydrogen barrier member and the second element.

2. The device according to claim 1, wherein the hydrogen barrier member has a box shape open at a lower face, the lower face being covered with the semiconductor substrate.

3. The device according to claim 1, wherein the insulating film includes silicon oxide, and the hydrogen barrier member includes:
    a sidewall surrounding the second element when viewed from above and being made from a metal; and
    a top plate contacting the sidewall and being made from silicon nitride.

4. The device according to claim 1, wherein the insulating film includes silicon oxide; and the hydrogen barrier member is formed as one body of silicon nitride.

5. The device according to claim 1, wherein the insulating film includes silicon oxide, and the hydrogen barrier member includes:
    a sidewall surrounding the second element when viewed from above and being made from a metal; and
    a box-shaped member surrounding the second element and the sidewall and being formed as one body of silicon nitride.

6. The device according to claim 1, wherein the first element is a transistor.

7. The device according to claim 1, wherein the second element is a transistor, a memory element, or a resistance element.

* * * * *